US006835993B2

(12) United States Patent
Sridevan et al.

(10) Patent No.: US 6,835,993 B2
(45) Date of Patent: Dec. 28, 2004

(54) BIDIRECTIONAL SHALLOW TRENCH SUPERJUNCTION DEVICE WITH RESURF REGION

(75) Inventors: Srikant Sridevan, Redondo Beach, CA (US); Daniel M. Kinzer, El Segundo, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 10/649,929

(22) Filed: Aug. 26, 2003

(65) Prior Publication Data

US 2004/0065934 A1 Apr. 8, 2004

Related U.S. Application Data (60) Provisional application No. 60/406,386, filed on Aug. 27, 2002, and provisional application No. 60/408,518, filed on Sep. 4, 2002.

(51) Int. Cl.[7] .................. H01L 23/58; H01L 29/76; H01L 29/94; H01L 31/062; H01L 31/113
(52) U.S. Cl. ............................. 257/492; 257/330
(58) Field of Search .................. 257/330, 492

(56) References Cited

U.S. PATENT DOCUMENTS 4,754,310 A * 6/1988 Coe ........................... 257/287
6,509,220 B2 * 1/2003 Disney ....................... 438/197
6,566,709 B2 * 5/2003 Fujihira ...................... 257/339
6,787,872 B2 * 9/2004 Kinzer et al. ............... 257/492

OTHER PUBLICATIONS

Xu, S., et al., "120 V Interdigitated–Drain LDMOS (IDLD-MOD) on SOI Substrate Breaking Power LDMOS Limit", Oct. 2000, IEDM 2000, pp. 1980–1985.*

* cited by examiner

*Primary Examiner*—Howard Weiss
(74) *Attorney, Agent, or Firm*—Ostrolenk, Faber, Gerb & Soffen, LLP (57) ABSTRACT

A lateral conduction superjunction device has bidirectional conduction characteristics. In a first embodiment, spaced vertical trenches in a P substrate are lined with N diffusions. A central MOSgate structure is disposed centrally in the parallel trenches and source and drain electrodes are at the opposite respective ends of the trenches. In a second embodiment, flat layers of alternately opposite conductivity types have source and drain regions at their opposite ends. A trench MOSgate is disposed between the source region at one end of the layers to enable bidirectional currant flow through the stocked layers.

18 Claims, 10 Drawing Sheets

BIDIRECTIONAL SHALLOW TRENCH SUPERJUNCTION DEVICE WITH RESURF REGION

RELATED APPLICATIONS

This application claims the benefit of U.S. Provisional Application No. 60/406,386, filed Aug. 27, 2002 and U.S. Provisional Application No. 60/408,518, filed Sep. 4, 2002.

This application is related to application Ser. No. 09/891,727, filed Jun. 26, 2001.

FIELD OF THE INVENTION

This invention relates to semiconductor devices and more specifically relates to lateral conduction and bidirectional conduction superjunction devices.

BACKGROUND OF THE INVENTION

MOSFET superjunction devices are well known and are disclosed in U.S. Pat. Nos. 4,754,310 and 5,216,275 and in a publication entitled "Simulated Superior Performance of Semiconductor Superjunction Devices" by Fujihara and Miyaska in the Proceedings of 1998 International Symposium on Semiconductor Devices & ICs, pages 423 to 426. Such superjunction devices have required deep trenches or sequentially deposited and diffused P and N epitaxially layers of silicon for their production.

Superjunction devices also frequently employ deep spaced pillars of semiconductor material of one conductivity in a substrate of the opposite conductivity type. The total charge of the pillars is matched to that of the surrounding substrate in which they are received to enable the use of a high concentration substrate which has a reduced $R_{DSON}$ in forward conduction, while blocking is obtained by equally depleting out charge from substrate and pillars. A conventional DMOS gate structure is used to turn the device on and off.

It would be desirable to make a superjunction device of simpler structure to enable the use of a simpler manufacturing process than that used to form the deep spaced pillars; and to make a device that can be bidirectional and capable of blocking voltage applied to either the source or drain, relative to the other terminal. It would also be desirable to have such a device which does not require a termination structure.

BRIEF SUMMARY OF THE INVENTION

In accordance with the invention, a novel device structure which is symmetric and in which the source and drain terminals are interchangeable is provided. The source and drain terminals are placed within regions which are capable of supporting high reverse voltage as well as possessing low resistivity. Current flow in the channel region which is between these regions is controlled by a gate electrode.

In a first embodiment, the device employs laterally extending parallel spaced vertical trenches with sidewall diffusions which are easily fabricated.

In a second embodiment, lateral interleaved layers of N and P materials and a trench gate are used. The layers can be formed by successive depositions of N or P epitaxial silicon, each layer being diffused with the opposite conductivity type. No masking is needed for these steps, and no termination structure is needed. Thus, the semiconductor drift region comprises alternate N-type and P-type regions one on top of the other to allow high voltage blocking during the blocking mode while permitting low resistance to current flow during the conduction mode.

In a bidirectional embodiment, capable of blocking voltage applied to either the drain or source terminal relative to the other, the device structure is symmetric in which the source and drain terminals are interchangeable. The source and drain terminals are placed within regions which are capable of supporting high reverse voltage as well as possessing low resistivity. A gate electrode controls current flow into the drift region.

DETAILED DESCRIPTION OF THE DRAWINGS

To place the embodiments of the present invention in perspective, the structure of the lateral superjunction device disclosed in copending application Ser. No. 09/891,727 (IR-1698) is first described in connection with FIGS. 1 to 12.

Figure 1:
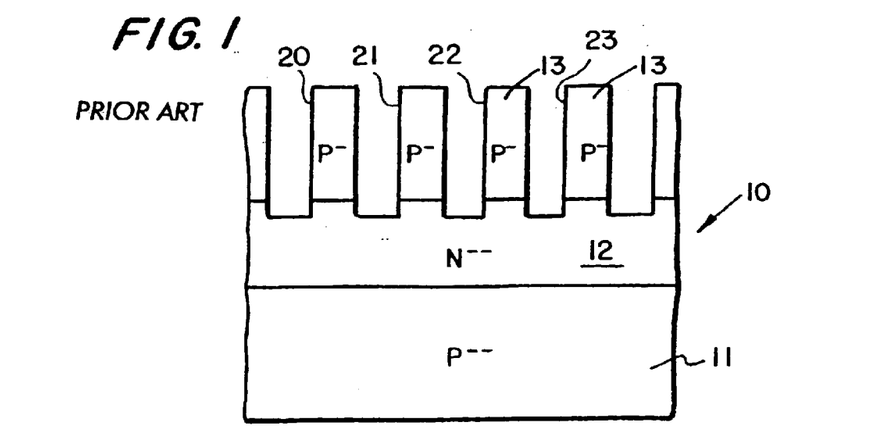
FIG. 1 is a cross-section through a small section of the active area of a wafer after the etching of trenches therein in a process to make a device in accordance with the disclosure of copending application Ser. No. 09/891,727 (IR-1698).

Referring first to FIG. 1, there is shown a small portion of the active area of a wafer 10 of silicon which is to be processed to form a lateral superjunction device. Wafer 10 may have a very lightly doped $P^-$ main body 11 of float zone material. A very lightly doped epitaxial layer of $N^-$ silicon 12 is grown atop layer 11. $P^-$ region 13 is next epitaxially grown atop the $N^-$ region 12.

For a 600 volt device, the P⁻ region 11 may have a concentration of about 2E14 of any desired P type impurity. The N⁻ region 12 may have a concentration corresponding to a dose of 1E12 of a suitable impurity species, thus forming a RESURF dose. The P⁻ region 13 has a concentration corresponding to a double RESURF dose of 2E12 of a suitable P type impurity.

As further shown in FIG. 1, a plurality of parallel laterally elongated trenches 20 to 23 are formed through the P⁻ region 13 and into the top of N⁻ region 12. The trenches may be of any length, depending on the desired breakdown voltage of the device, and, for a 600 volt device, may be about 40 microns long. The mesa width, that is, the space between trenches, may be about 1.0 microns and the trenches may be about 5 microns deep and about 0.5 microns wide. The trenches preferably extend into N⁻ region 12 for about 0.15 microns. To obtain the desired RESURF dose for the above sized mesa, a P⁻ concentration of 2E16 ions/cm³ should be used.

Figure 2:
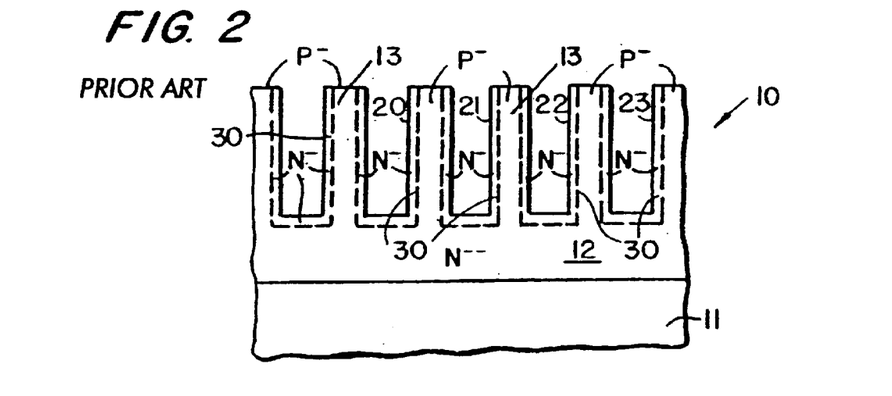
FIG. 2 is a cross-section of the area of FIG. 1 after the formation of an $N^-$ implant in the trench walls and bottom.

After forming trenches 20 to 23, and as shown in FIG. 2, the walls of the trenches receive an N⁻ diffusion 30 which produces a RESURF diffusion of equivalent dose of 1E12/cm² along the bottoms of the trenches. In order for the structure to work properly, the depth of P⁻ diffusion 30 and the depth of the trench should be close to one another, and, below the trench, the P concentration should drop to the amount required to support 600 volts (the BV voltage) in the bulk, which is about 2E14 ions per cm³. One way to achieve this is to control the concentration of the P deposit in the mesas is by diffusion from the sidewalls. The doping could also be achieved by diffusion from a doped film or by bombardment with a doped plasma.

Figure 3:
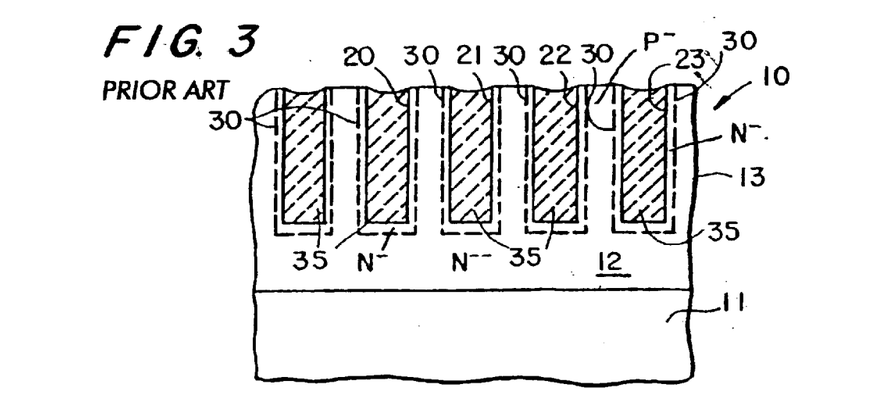
FIG. 3 is a cross-section of FIG. 2 after the grooves are filled with oxide.

As next shown in FIG. 3, a suitable dielectric, for example, silicon dioxide 35, fills in the trenches by thermal growth or by deposition.

Figure 4:
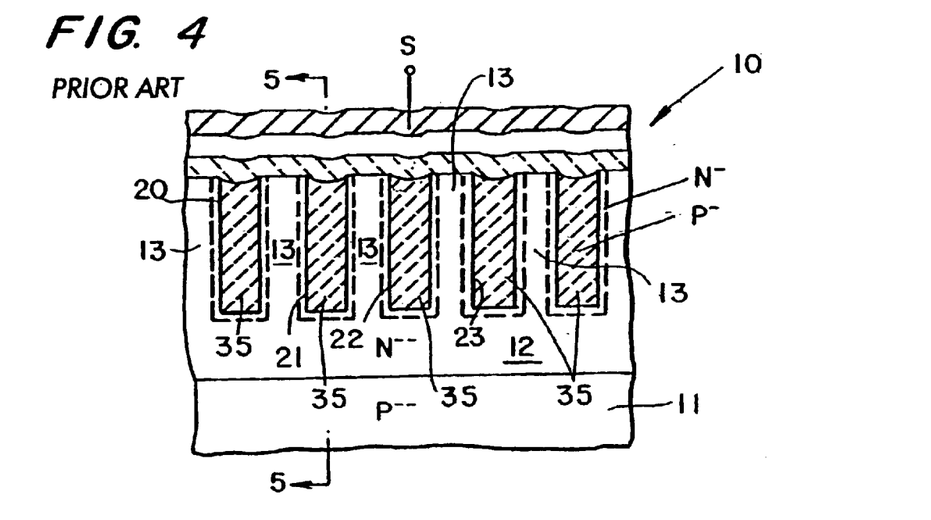
FIG. 4 is a cross-section like that of FIG. 3 after the deposition of oxide over the full upper surface of the active area and is a cross-section of FIG. 5 taken across section line 4—4 in FIG. 5.
Figure 5:
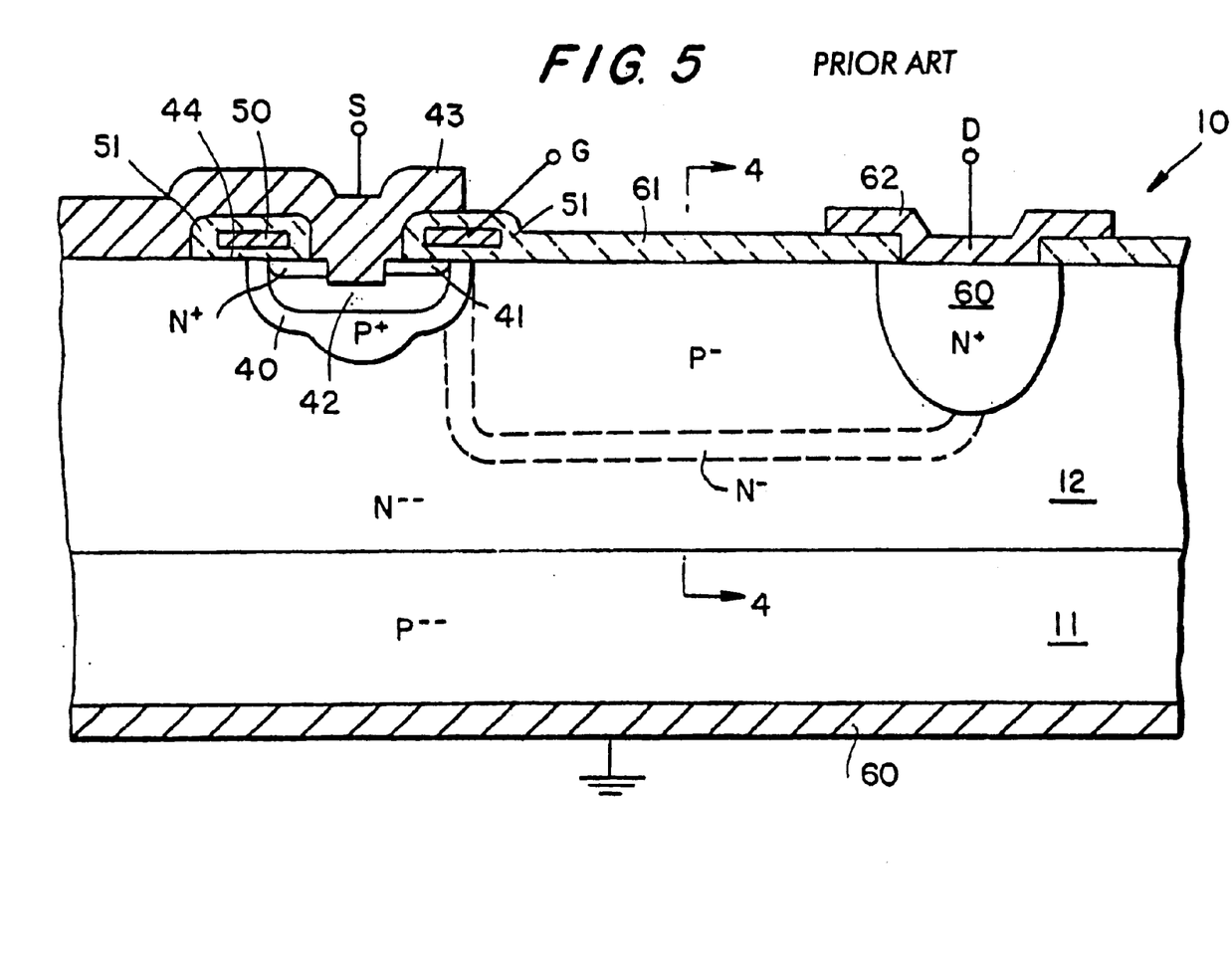
FIG. 5 is a cross-section of FIG. 4 taken across section line 5—5 in FIG. 4.

As next shown in FIGS. 4 and 5, a MOSgate structure is formed (in any desired sequence) and the source and drain electrodes are also formed. More specifically, the MOSgate structure may include a conventional P⁻ 40 which contains an N⁺ source 41. A P⁺ diffusion 42 may also underlie the source region. The center of the source/base structure receives a shallow etch which is later filled by source electrode 43. A conventional gate oxide 44 covers the lateral invertible channel between the source 41 and the lightly doped portion of base 40 regions and a conductive polysilicon gate electrode 50 overlies the gate oxide. An insulation layer 51 of low temperature oxide, for example, insulates gate electrode 50 from the source metal 43.

As next shown in FIG. 5, an N⁺ sinker 60 extends from the top of P⁻ region 13 to N⁻ diffusion 30 and the N⁻ region 12. The top of regions or mesas 13 receives a field oxide 61 (FIGS. 4 and 5) which has an opening there through to receive drain contact 62 which contacts N⁺ sinker 60.

Figure 6:
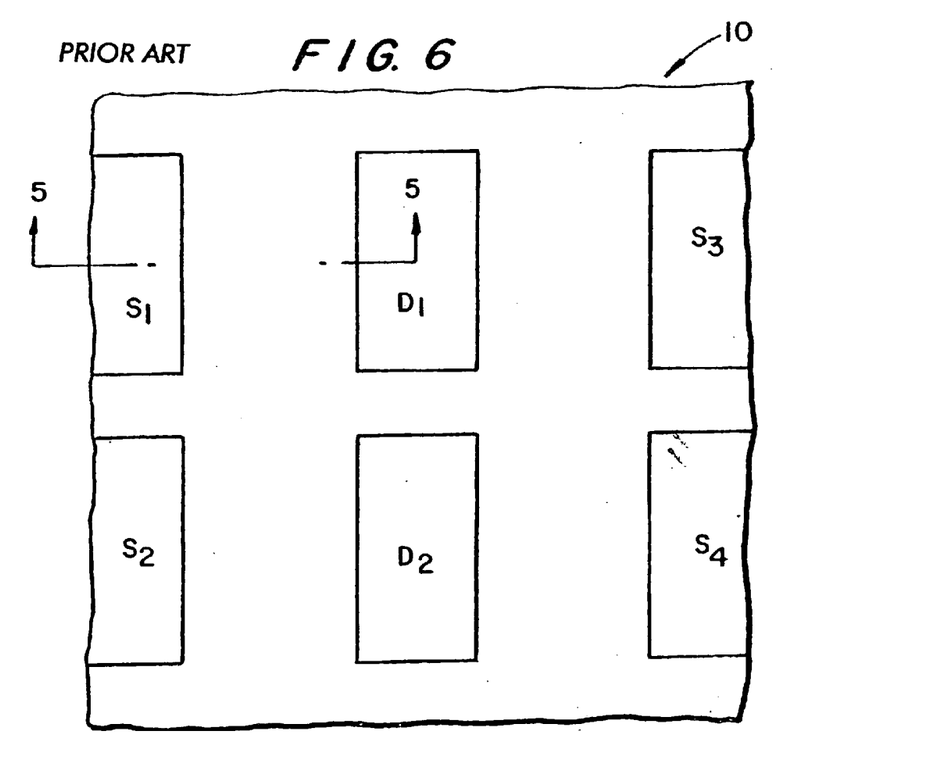
FIG. 6 is a top view of the wafer of FIGS. 4 and 5, showing the main electrode for a plurality of devices integrated into a common chip.

FIG. 6 shows a topology which can be used for the structure of FIGS. 4 and 5, where a plurality of separate but repeating elements are formed which each laterally adjacent source and drain regions $S_1$ to $S_4$ and $D_1, D_2$ have the same structures as shown in FIGS. 4 and 5. The source regions $S_1$ to $S_4$ may be for separate integrated devices, or alternatively, may be connected together and, similarly, drains $D_1$ and $D_2$ may be separate or connected together. Gate electrodes $G_1$ to $G_4$ may also be located adjacent sources $S_1$ to $S_4$ respectively and are connected to their respective gate electrodes such as gate electrode 50.

The Operation of the Device of FIGS. 4 and 5 is as Follows:

In the blocking mode, and when source 43 and gate 50 are grounded with respect to substrate 12, and a high relative bias is applied to drain 62, the voltage in the lateral direction is supported entirely in the trench structure, and P⁻ regions 13 and N⁻ diffusions 30 fully deplete, allowing an almost uniform electric field distribution along the trench length. This depletion region extends downwardly into N⁻ region 12.

In the conduction mode of operation, and with the application of a bias to gate electrode 50 and the grounding of source 43 relative to substrate 12, an N type channel is formed between source regions 41 and base 40. The application of a bias to drain 60 will cause a current to flow in the device through the undepleted P⁻ and N⁻ regions 13 and 30.

Figure 7:
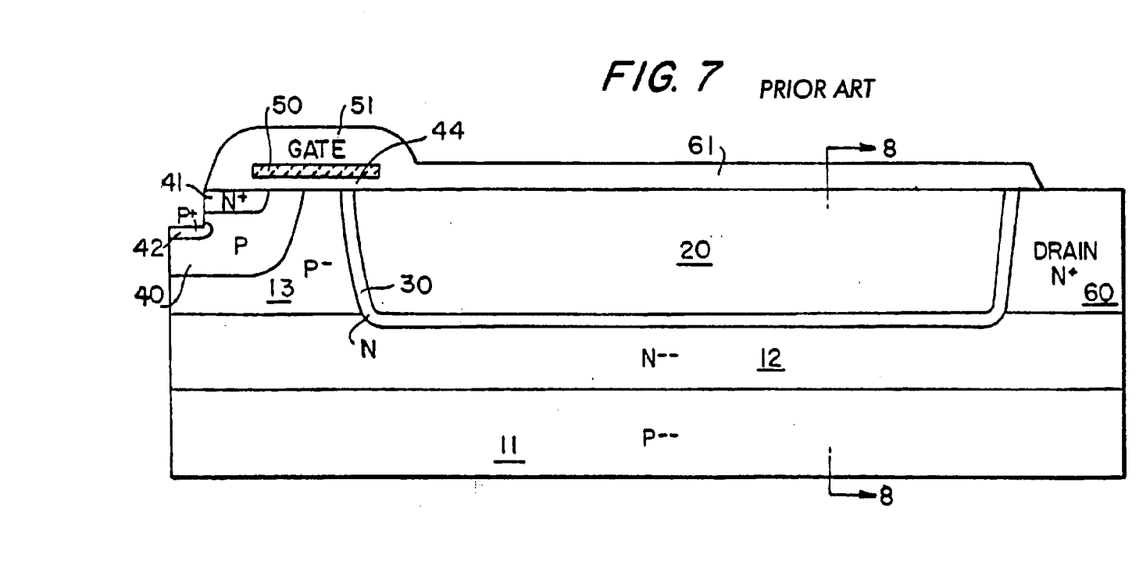
FIG. 7 and FIG. 8 are similar to FIGS. 4 and 5 respectively.
Figure 8:
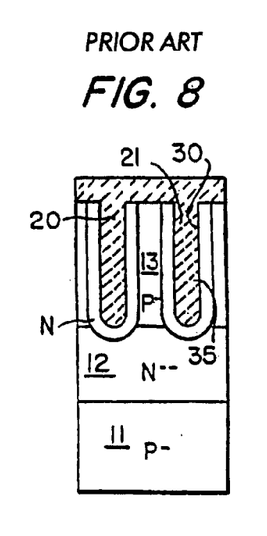

Referring next to FIGS. 7 to 11, the structure of FIGS. 4 and 5 is duplicated in FIGS. 7 and 8 so that it can be easily contrasted to the two additional embodiments of FIGS. 9, 10 and FIGS. 11 and 12 respectively. The same numerals are used throughout to identify similar components.

Figure 9:
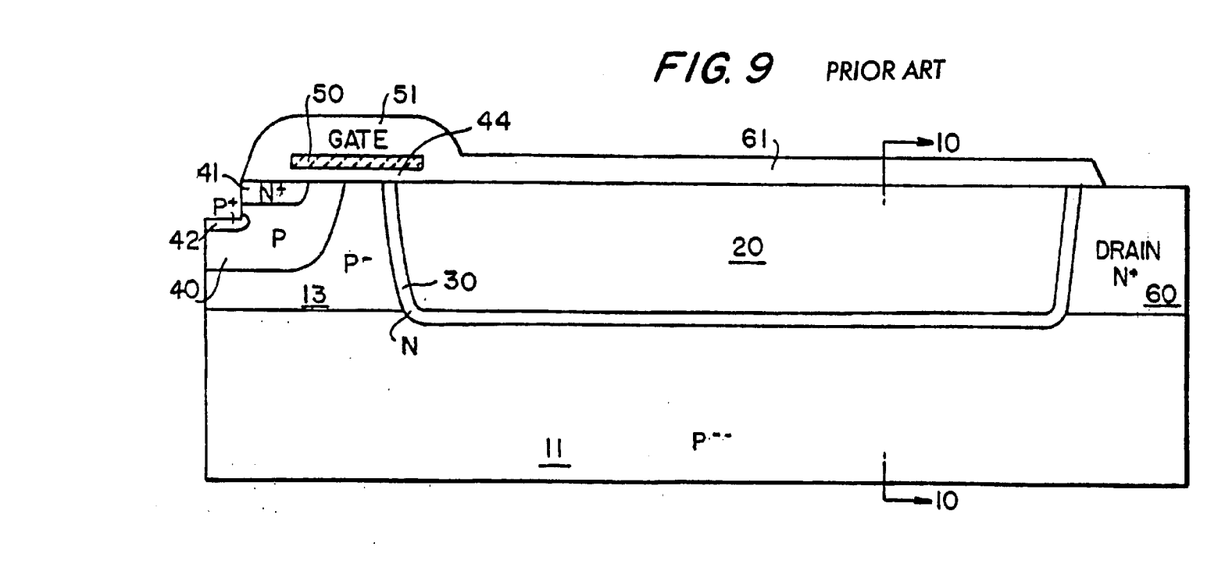
FIGS. 9 and 10 show a second embodiment of the structure of FIG. 7 and 8 which eliminates the intermediate N type epi layer of FIGS. 7 and 8.
Figure 10:
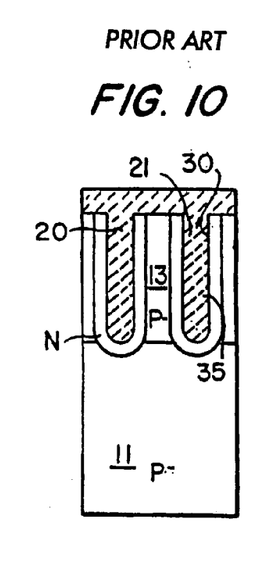

Referring to FIGS. 9 and 10, there is shown a simplified arrangement compared to that of FIGS. 4, 5, 7 and 8 which eliminates the N⁻ region 12 of FIGS. 7 and 8. Thus, the source 41 and substrate 11 are shorted so the device cannot withstand voltage (preventing its use as a high-side switch). However, the device of FIGS. 9 and 10 withstands voltage between the drain 60 and the source electrode by the resurf principle.

Figure 11:
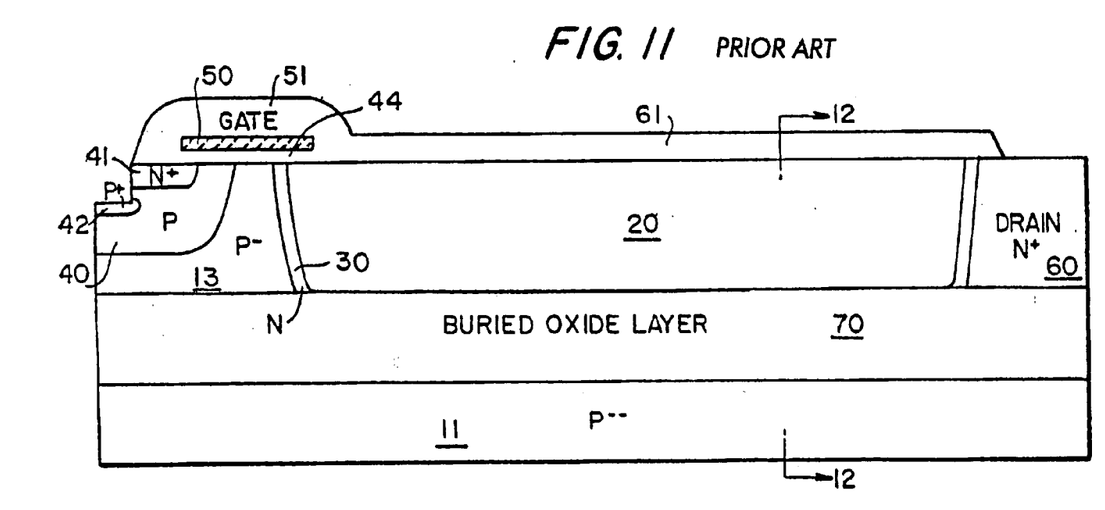
FIGS. 11 and 12 show the structure of FIGS. 7 and 8 in which an oxide insulation layer is used in place of the N type epi layer of FIGS. 7 and 8.
Figure 12:
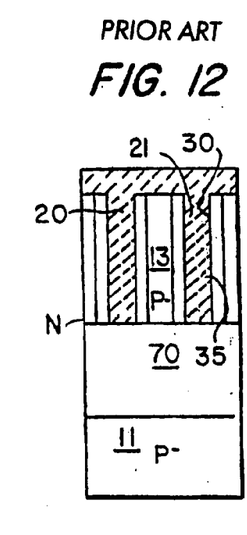

Referring next to FIGS. 11 and 12, an oxide insulation layer 70 is used in place of N⁻ region 12 and the active area is formed on the surface of layer 70. Thus, the device, unlike that of FIGS. 7 and 8, can be used as a high-side switch.

Figure 13:
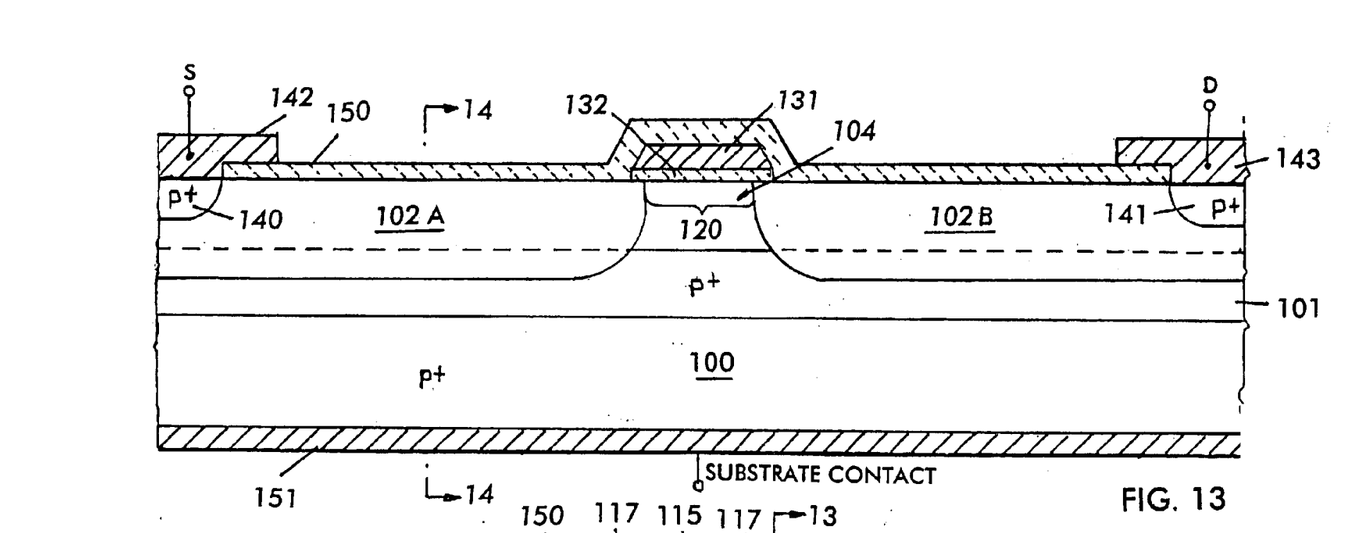
FIG. 13 is a cross-section of a small portion of a chip or die made in accordance with the invention.
Figure 14:
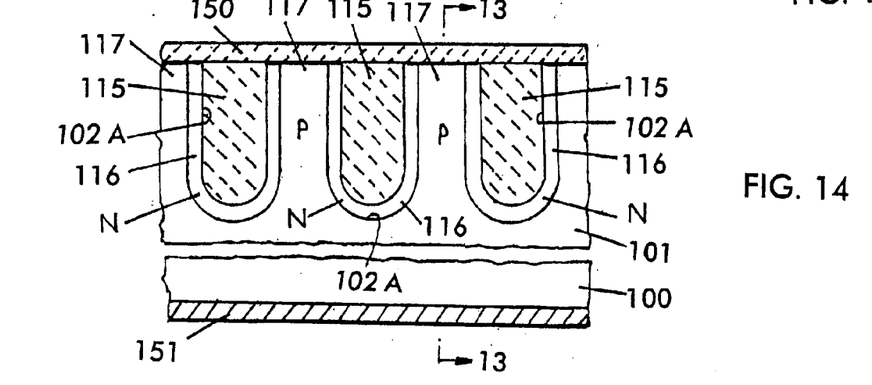
FIG. 14 is a cross-section of FIG. 1 taken across section line 14—14 in FIG. 13, showing two adjacent ones of the plural spaced trenches of the device.

The first embodiment of the invention is shown in FIGS. 13 and 14 and is a modification of the structure of FIGS. 7 to 12 to produce a bidirectional conduction device.

In FIGS. 13 and 14, semiconductor substrate 100 upon which the device is formed is a high resistivity P-type substrate (preferably about 50 ohm.cm). All conductivity types hereinafter described can be reversed. A P type implant or an epitaxial layer 101 is grown atop substrate 100 to any desired thickness with a concentration of impurity atoms (boron for example) of $1 \times 10^{16}$ per cm³. A further P type implant is performed upon substrate 101 to create a P-type region 104 (FIG. 13) doped to about $1 \times 10^{17}$ cm⁻³. This is required to obtain the desired threshold voltage for conduction. A plurality of trenches 102 (FIG. 14) each of which is 5 micron deep, about 0.5 micron wide, and spaced from one another (into the plane of the paper) by 0.5 micron apart, and are about 85 to 90 microns long are then etched into P region 104 and penetrate into the substrate 101 beneath region 104. The trenches 102 are in one half of the device and are interrupted by a gap 120 to define trench sections 102A and 102B (FIG. 13). The sidewalls and bottoms of each of these trenches receive N-type diffusions 116 while the mesa regions 117 between the trenches remain P-type. The doses in the N regions 116 and P mesas 114 is such that the cumulative doping in all regions 117 and 116 is N-type.

The trenches 102A and 102B are filled with a dielectric 115 such as a silicon dioxide. The space 120 between the groups of trenches 102A and 102B constitutes the invertible channel whose conductivity can be modulated by the application of bias to the gate electrode 131 which is separated from the channel by the gate oxide 132. High dose, low energy implants are then performed in the central regions of these trench groups 102A and 102B to form shallow, extremely low resistivity source regions 140 and drain regions 141. Ohmic contacts 142 and 143 are made to these regions 102A and 102B, respectively. The trench groups 102A and 102B are passivated by means of a suitable dielectric film 150. Electrical contact to the semiconductor substrate is provided a back-side metallization 151.

Blocking Operation of FIGS. 13 and 14:

When the source 142 and gate 131 are grounded with respect to the substrate contact 151 and a high relative bias applied to the drain contact 143, the voltage in the lateral direction is supported entirely in the 40 micron long trench 102B with minimal depletion in the channel region 104, allowing reduced channel lengths. This is due to the RESURF effect where the N-type implants 116 and the mesa doping 117 in trenches 102B laterally deplete out completely, allowing an almost uniform electric field distribution in the entire group 102B. Directly below the drain implant region 141, a punchthrough $N^+NP^-$ diode is present and the applied bias is supported mainly in the $P^-$ region with the depletion region extending about 40-50 microns into the substrate. The potential at the bottom of the deep trenches 102B is highest below the drain 141 and reduces gradually, moving away from drain region 141 towards the periphery of group 102B, reducing to near zero at a distance of about 40 microns from region 141. This contours the depletion region in the substrate and acts as a self-termination.

Conduction Operation of FIGS. 13 and 14:

With the application of a bias to the gate electrode 131 and the grounding of the source 142 with respect to the substrate 151, an N-type channel is formed on the surface of channel 104. The application of a small bias to the drain 143, 141 will cause a current to flow in the device. At this low bias the trench regions 102A and 102B are not depleted and hence the current can flow from the drain metal 143 into the region 141 and then into the sidewalls 116 in group 102B and then into surface channel 104 and then into the sidewalls 116 in group 102A and finally into the source region 140 and into the source metal 142. The use of the RESURF principle allows the resistivity of the trench sidewalls 116 to be substantially less than that of a plane parallel drift region capable of supporting the same blocking voltage.

Figure 15:
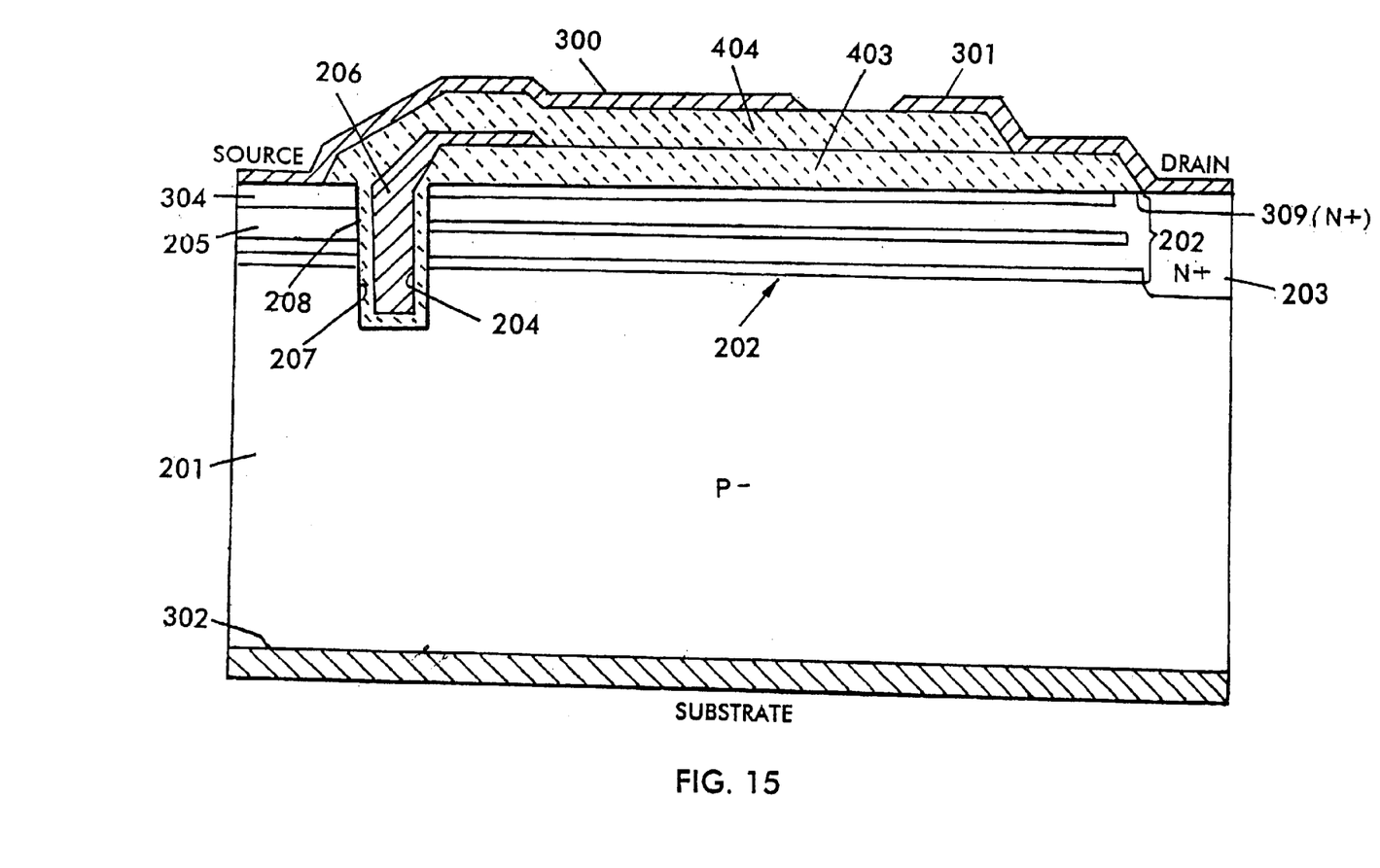
FIG. 15 is a cross section of a small portion of a superjunction chip mode in accordance with the invention and using a single gate.
Figure 16:
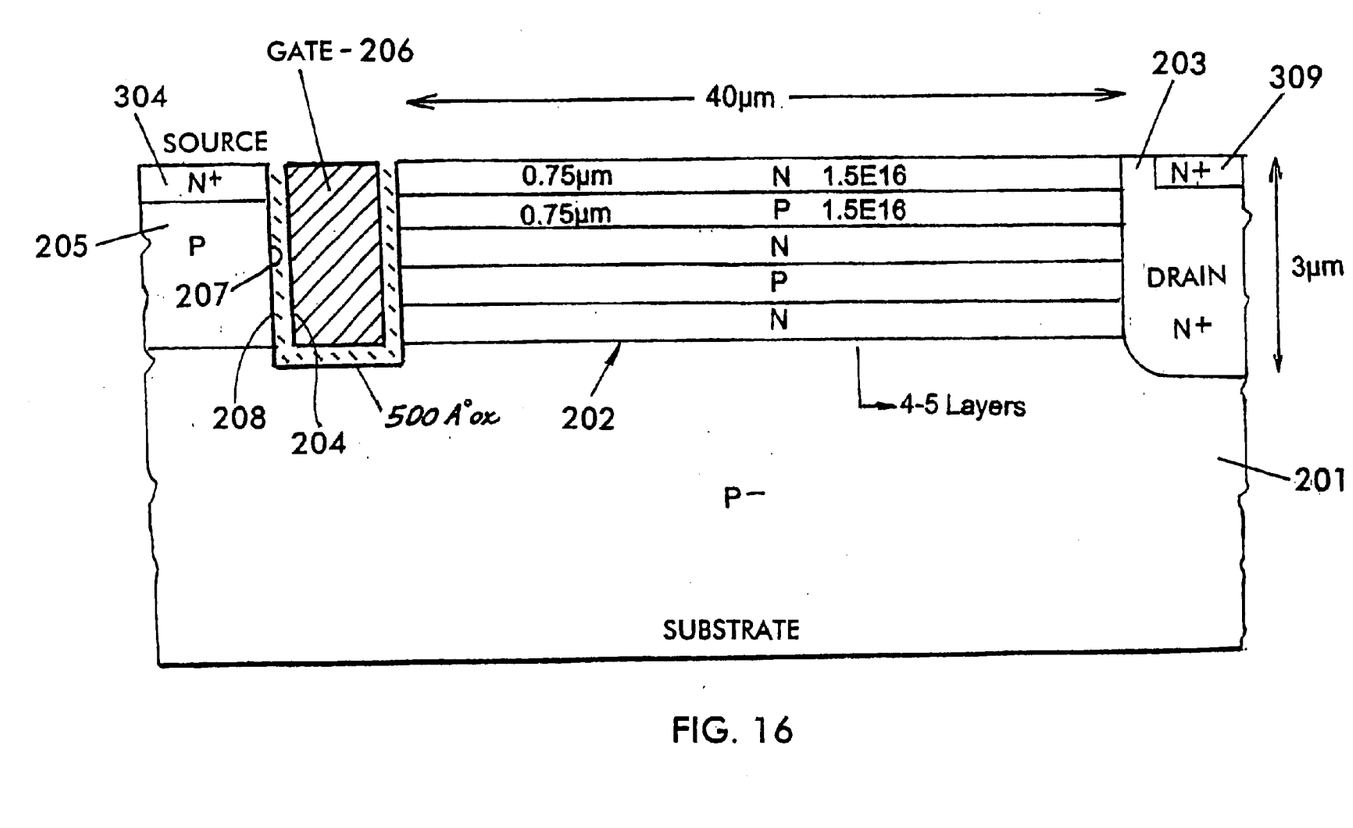
FIG. 16 is a schematic representation of FIG. 1 with particular relevant process detail added.

A second embodiment of the invention is shown in FIGS. 15, 16, 17A and 17B for a geometry in which the interleaved layers are parallel to the surface of the wafer or chip which receives the devices. Thus, FIGS. 15 and 16, show a cross-section of a chip of the invention which requires no critical mask step for its fabrication and requires no termination. Further, the device of FIGS. 15 and 16 is a undirectional conduction embodiment, which can be easily made bidirectional by creating a symmetrical gate structure.

In FIGS. 15 and 16 semiconductor substrate 201 upon which the device is formed is a high resistivity $P^-$ type substrate (preferably about 50 ohm.cm). A region 202 comprising alternating N-type and P-type layers are then provided on the top surface of substrate 201 either by means of epitaxy or ion implantation or their combination. Each layer of region 202 has a dose of approximately $1E\ 10^{12}\ cm^{-2}$ and is approximately 0.5 to 1.0 micron thick. A relatively low resistivity N-type region 203 is created at one end of structure 202, extending through to region 201. Grooves such as groove 207 are etched into the top surface of region 202, extending into substrate 201, and separated from region 203 by a pre-determined distance of, for example, approximately 45 microns. Grooves 207 are lined with a gate oxide 204. The region 202 on the opposite side of groove 207 from region 203 maybe be doped $P^-$ to about $1E\ 10^{12}\ cm^{-2}$ up to a desired depth to create the $P^-$ body region 205 and to fix the threshold voltage. A conductive gate electrode 206 (conductive polysilicon) is provided in trench 207 separated from region 202 by a gate oxide 204. The semiconductor surface between the P body region 205 and the gate oxide 204 constitutes the device channel whose conductivity can be modulated by the application of bias to the gate electrode 206.

High dose low energy implants are then performed in the top surface of regions 205 and 203 to form shallow, extremely low resistivity source regions 304 and drain regions 309. The layers 202 are passivated by dielectric layers 403 and 404 (such as TEOS or the like) which insulate gate electrode 206 and source and drain electrodes 300 and 301 respectively from region 202. Electrical contact to the semiconductor substrate is provided with a backside metallization 302.

It should be noted that the structure of FIGS. 1 and 2 can be made bidirectional, simply by adding a second gate structure symmetric with gate 206.

The operation of the device of FIGS. 1 and 2 is as follows considering the diagrams of FIGS. 17A and 17B. First considering operation in the blocking condition (FIG. 17B) where the source 300 and gate 206 are grounded with respect to the substrate 201 and a high relative bias applied to the drain 301, the voltage in the lateral direction is supported entirely in the 45 micron long epitaxial region 202. The sidewalls of the grooves 207 facing region 203 are held to a potential close to that of the substrate by the formation of conducting PMOSFETs on that sidewall. The region 202 depletes out completely allowing an almost uniform electric field distribution along its length. Directly below the drain implant region 203 (FIG. 15), an $N^+NP^-$ diode is present and the applied bias is supported mainly in the $P^-$ region 201 with the depletion region extending about 40-50 microns into the substrate. The potential at the bottom of region 202 is highest below the drain 203 and reduces gradually moving away from region 203 towards the grooves 204, reducing to near zero at a distance of about 45 microns from drain 203. This contours the depletion region in the substrate and acts as a self-termination.

Considering next the operation in the conduction mode (FIG. 17A), with the application of a bias to the gate electrode 206 and the grounding of the source 304-300 with respect to the substrate 201, an N-type channel is formed on the channel surface 208. The application of a small bias to the drain 203–301 (FIG. 15) will cause a current to flow in the device. At this low bias the regions 202 are not depleted and hence the current can flow from the drain metal 301 into the region 309 (FIG. 15) and then into the region 202 and then around the groove 207 into surface channel 208 (FIGS. 15 and 17A) and then into the source region 304 and into the source metal 300. The use of the RESURF principle allows the resistivity of the layers 202 to be substantially less than that of a plane parallel drift region capable of supporting the same blocking voltage. Thus, the device conducts with very low on resistance.

Figure 17A:
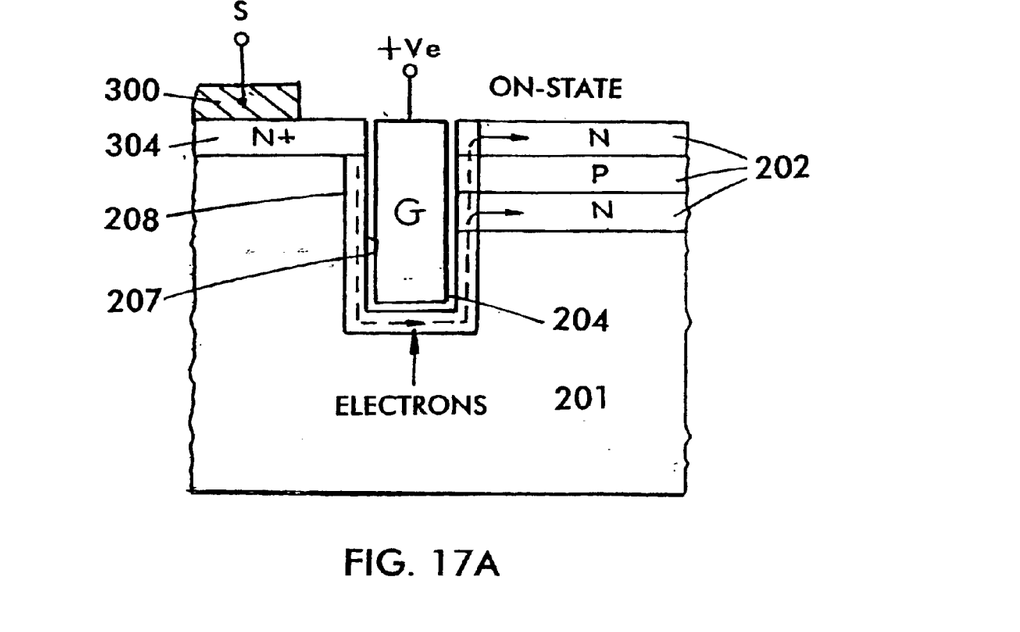
FIGS. 17A and 17B are diagrams showing the operation of the device of FIGS. 15 and 16 in the on state and off state respectively.
Figure 17B:
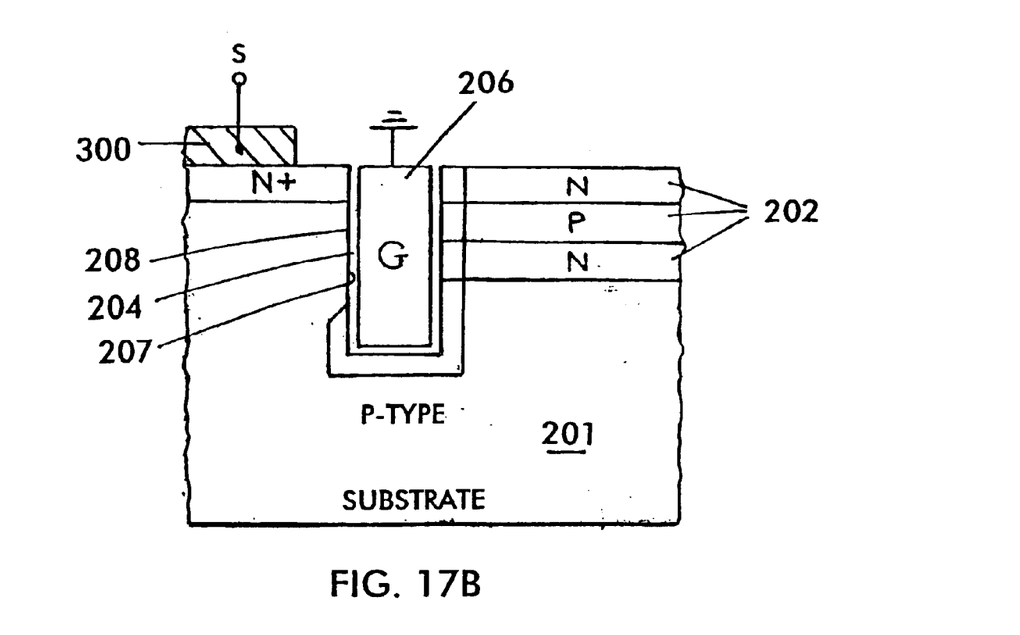

To summarize these operations which are schematically illustrated in FIGS. 17A and 17B; in the on state, as shown in FIG. 17A, electrons are conducted from the source and around the side and bottom of groove 204. In the off state, as shown in FIG. 17B, it will be noted that:

1. The hole layer electrically connects the P regions of epitaxial regions 202 to the substrate 201;

2. The N layers of region 202 are tied to the high potential of the drain; and

3. The full length of region 201 uniformly depletes out.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A bidirectional conduction superjunction device comprising a silicon substrate having a first and second laterally spaced plurality of parallel trenches extending perpendicularly into a surface of said substrate of a first conductivity type; a first end of said first plurality of trenches being laterally spaced from a first end of said second plurality of trenches by an invertible channel region; the interior surfaces of each of said trenches being of a second conductivity type; a source contact and a drain contact connected to respective second ends of said first and second plurality of trenches respectively; and a MOSgate structure connected to said invertible channel region.

2. The device of claim 1, wherein said trenches are spaced by mesa regions, and wherein the charge of said first conductivity type of the mesa regions is at least approximately matched by the charge of the diffusion of said second conductivity type which lines said trenches.

3. The device of claim 2, wherein said first conductivity type is P and said second conductivity type is N.

4. The device of claim 2, wherein said device is free of a termination.

5. The device of claim 1, wherein said first conductivity type is P and said second conductivity type is N.

6. The device of claim 5, wherein said device is free of a termination.

7. The device of claim 1, wherein said device is free of a termination.

8. A bidirectional conduction superjunction device comprising a substrate of the first conductivity; and a plurality of thin layers formed atop said substrate and stacked atop one another and lying in planes parallel to one another; said layers alternating in conductivity from a second conductivity type to said first conductivity type; a drain diffusion of said second conductivity type disposed adjacent to and connected to one end of each of said layers; a trench gate structure formed in said substrate and having one wall extending along the opposite ends of each of said layers; a gate oxide lining the interior of said trench gate an a conductivity gate material filling the interior of said trench; a source diffusion of said second conductivity type adjacent a second wall of said trench and said gate structure including a bottom portion extending between said one wall and said second wall of said trench; and a source and drain contact connected to said source and drain diffusions respectively; whereby the application of a potential to said conductive gate material enables conduction between said source and drain electrodes through a conduction path that includes a portion adjacent said bottom portion of said trench.

9. The device of claim 8, wherein the total charge in each of said layers is approximately the same.

10. The device of claim 9, wherein said first conductivity is P and said second conductivity type is N.

11. The device of claim 8, wherein said first conductivity is P and said second conductivity type is N.

12. The device of claim 8, wherein each of said layers has the same thickness.

13. The device of claim 12, wherein each of said layers is about 0.75 microns thick.

14. The device of claim 8, wherein each of said layers has a concentration of about $1.5 \times 10^{16}$ impurity carriers per $cm^3$.

15. A bidirectional superjunction device comprising a plurality of laterally extending regions of alternately opposite conductivity type; a drain region connected to one end of said laterally extending regions and a source region connected to the opposite end of said laterally extending regions; a source electrode and a drain electrode connected to said source and drain regions respectively; and a MOSgate structure coupled to said laterally extending regions and disposed between said source and drain regions and controlling conduction between said source and drain regions; wherein said laterally extending regions are defined by parallel trenches in a substrate of a first conductivity type, and diffusions of the opposite conductivity type in the walls of said trenches; and said MOSgate structure is disposed between said laterally extending trenches.

16. The device of claim 15, wherein adjacent ones of said laterally extending regions are charge balanced.

17. The device of claim 16, wherein said laterally extending regions are disposed as flat layers atop the surface of a silicon substrate.

18. The device of claim 17, wherein said MOSgate structure is a gate trench disposed between one end of said laterally extending regions and said source region; said gate trench having a gate oxide liner and is filled with a conductive gate.

* * * * *